(12) United States Patent
Gismervik et al.

(10) Patent No.: US 11,506,303 B2
(45) Date of Patent: Nov. 22, 2022

(54) VALVE POSITION SENSOR INCLUDING A MAGNETOMETER AND GYROSCOPE

(71) Applicant: SENTEC AS, Laksevåg (NO)

(72) Inventors: Øystein Gismervik, Bjørndalstræ (NO); Ronny Karlsen, Bergen (NO); Jørn R Sandø, Rådal (NO)

(73) Assignee: SENTEC AS, Laksevåg (NO)

( * ) Notice: Subject to any disclaimer, the term of this patent is extended or adjusted under 35 U.S.C. 154(b) by 494 days.

(21) Appl. No.: 16/606,457

(22) PCT Filed: Apr. 19, 2018

(86) PCT No.: PCT/EP2018/060102
§ 371 (c)(1),
(2) Date: Oct. 18, 2019

(87) PCT Pub. No.: WO2018/193058
PCT Pub. Date: Oct. 25, 2018

(65) Prior Publication Data
US 2020/0132217 A1 Apr. 30, 2020

(30) Foreign Application Priority Data
Apr. 19, 2017 (NO) .................................. 20170634

(51) Int. Cl.
*F16K 37/00* (2006.01)
*G01D 5/12* (2006.01)
*G01D 18/00* (2006.01)

(52) U.S. Cl.
CPC .......... *F16K 37/0041* (2013.01); *G01D 5/12* (2013.01); *G01D 18/008* (2013.01); *F16K 37/0033* (2013.01)

(58) Field of Classification Search
CPC ............ F16K 37/0033; F16K 37/0041; G01D 18/008; G01D 5/12; G01R 33/028; G01R 35/00; G01R 33/02
See application file for complete search history.

(56) References Cited

U.S. PATENT DOCUMENTS

2015/0019159 A1 1/2015 Elgersma et al.
2017/0343349 A1* 11/2017 Han ................... G01R 33/0035

FOREIGN PATENT DOCUMENTS

| EP | 859964 | 11/2006 |
|---|---|---|
| JP | 2016075362 | 5/2016 |
| WO | 2016074153 | 5/2016 |

* cited by examiner

*Primary Examiner* — Jay Patidar
(74) *Attorney, Agent, or Firm* — Workman Nydegger (57) ABSTRACT

A valve position sensor is described. The valve position sensor includes a sensor housing for placement on a moving component of a valve. A print circuit board assembly is disposed within the housing. The print circuit board assembly includes one or more micro sensors that includes a magnetometer and a gyroscope. A processing unit performs a calibration routine that associates magnetometer data received from the magnetometer with valve position data received from the gyroscope. The processing unit receives data from the magnetometer and compares the received magnetometer data with the calibration data to determine valve position data relating to an estimate of the valve position. A transmitter wirelessly transmits event data including valve position data to an external receiver.

15 Claims, 7 Drawing Sheets

VALVE POSITION SENSOR INCLUDING A MAGNETOMETER AND GYROSCOPE

This application is a 371 Nationalization of International Application No. PCT/EP2018/060102, filed Apr. 19, 2018, which claims priority to Norwegian Patent Application No. 20170634, filed Apr. 19, 2017, the disclosures of which are hereby disclosed in their entireties herein.

TECHNICAL FIELD

The present invention relates to a valve position sensor, and a method for monitoring and determining the valve position of a valve.

BACKGROUND

Manual and automated valves are installed in vast quantities in many different types of processing plants. Large quantities are installed in the oil and gas industry, pulp & paper, chemical, pharmaceutical and similar processing plants.

In many such applications it is important to know the valve positions of the valves within a system in order to ensure the correct functioning of the system and to ensure safety. The need to determine and record the positions of the valves in a system is vital for both optimum process control during operation but also for maintenance, for example when a system must be safely shut down or particular components isolated.

In known systems, generally only control valves with a cabled connection to the control panel or operating system allows for direct reporting to the operator or control system. The position of all other valves normally requires physical and/or visual inspection by the operator.

In larger plants with more complex piping systems and process flows spread over a larger area it becomes more difficult to manually determine the positions of valves. Cabled monitoring equipment is available however the cost of such equipment precludes their application of cabled sensors on more than just a small proportion of the valves in the system and also prevents the use of such equipment over large areas such as in the oil and gas industry.

Accordingly there is a need for a monitoring system which makes progress in overcoming the above problems with conventional monitoring procedures and known monitoring equipment. In particular, a low cost system is required which can operate over a large area and can reliably identify the position of a valve in a system.

SUMMARY OF THE INVENTION

According to a first aspect of the invention, there is provided valve position sensor comprising: a sensor housing for placement on a moving component of a valve; a print circuit board assembly disposed within the housing, the print circuit board assembly comprising: one or more micro sensors, the one or more micro sensors including a magnetometer; a processing unit configured to receive data from the magnetometer and compare the received magnetometer data with predetermined calibration data to provide an estimate of the valve position; and a transmitter for wirelessly transmitting event data including the estimate of valve position to an external receiver.

The valve position sensor according to the present invention thereby provides a reliable and cost-effective means to remotely determine the position of a valve. The use of standard micro sensor components, such as those provided by an IMU, means the sensors can be produced at low cost. This allows for the incorporation of the sensors on to a greater number of valves within a system allows a more complete picture of the performance of a system to be monitored.

The use of magnetometer data to determine position provides a reliable means to determine the position of the valve, which requires no additional components, being able to function based on the surrounding magnetic field, such as the local geomagnetic field. Using magnetic field data provides for accurate long term measurement, since the local magnetic field is substantially constant. This is in contrast to, for example, using purely gyroscopic data where long term drift and bit resolution of the gyroscope zero offset will give rise to integration errors, leading to fluctuations in estimated angle.

The use of a processing unit configured to compare current magnetometer data to predetermined stored data provides a reliable and computationally efficient means to determine valve position. The valve position sensor of the present invention furthermore is energy efficient such that it can be powered by a battery for a long period of time, minimising the cost and time involved in replacing of maintaining sensors deployed in a system.

Further advantages of the present invention can be summarised as follows:

a) The valve position sensors may be incorporated across a system at low cost, allowing a complete mapping of all manual valves including current position and when it was last operated. This provides critical information to the operator of process set-up and also possible need for inspection and maintenance of valves that has not been turned for a long period of time.

b) The sensor is easy to set-up, calibrate and operate and may be activated remotely by a companion App.

c) The valve position sensor is easy to install; as no cabling is required, the installation can be performed by simply fixing to the moving component of a valve. No further set-up is required.

d) The sensor technology is low cost and due to the ease of installation, installation is also low cost.

e) The valve positions sensors are readily combinable into a system which will work with one valve position transmitter up to a multitude of valve position transmitters.

The phrase "valve position" is intended to refer to the position of the moving component of the valve which defines the open/closed state of the valve. This term therefore refers to whether the valve is open, closed or at an intermediate position and may be defined by a relative angle from a known position such as a fully closed state.

In preferable embodiments the calibration data comprises an array of magnetometer data and associated valve position data stored in a memory unit. In this way, a computationally efficient method of determining position is provided in which the processing unit simply determines the magnetometer values from the stored table which provide the best fit and selects the corresponding valve orientation from the array. The calibration data may be preloaded onto a memory unit of the sensor, for example based on experiments on similar valves or the calibration data may be determined via a calibration process specifically for the particular valve and orientation in which the valve position sensor is fitted.

Preferably the housing is arranged to provide attachment to a moving component of a valve such that movement of the valve component provides a changing orientation of the valve position sensor relative to a local magnetic field which can be registered by the magnetometer. The housing may be adapted for attachment to a valve stem, valve handle or valve wheel or any other moving component which moves in accordance with the changing position of the valve between an open and closed state.

Preferably the one or more micro sensors further include a gyroscope and the processing unit is further configured to perform a calibration routine during an initial rotation of the valve to associate magnetometer data received from the magnetometer with valve position data received from the gyroscope and store the associated data in the array. The initial rotation may be provided manually or automatically, for example by a valve control system. Preferably the initial rotation is from a fully closed position to a fully open position to store magnetometer data associated with positions across the full range of movement.

The use of a gyroscope provides a reliable method to provide angular displacement data which can be associated with the received magnetometer data to provide the calibration data used to determine valve position. The use of a micro sensor gyroscope allows a high sample rate and accurate rotation data to be received by the processing unit and thereby determine the current position relative to a known start point with high accuracy.

Preferably the magnetometer data and/or the gyroscope data is in the form of a three dimensional value. In certain embodiments the gyroscope outputs three axis data at greater than 50 samples a second, more preferably greater than 100 samples a second, for example 200 samples a second. The samples may be digitally integrated to determine the current rotation angle from the start position.

Each of the x, y and z gyroscope data may be integrated to provide a current rotation angle in each axis of the gyroscope.

The magnetometer may output data at the same or a different sample rate as the gyroscope, with only corresponding values from the same point in time being stored in the calibration data of the array. In one example, the gyroscope outputs samples in three axes at 200 Hz, with the samples digitally integrated to determine the current rotation angle from the start position, and the magnetometer outputs a three axis set of magnetic field strength values at 8 Hz, with are stored in an array with the current position of the valve determined by the gyroscope data.

In certain examples of the present invention the calibration routine performed by the processing unit comprises: receiving initial magnetometer and gyroscope data while the valve is stationary at an initial position and storing the associated initial magnetometer and gyroscope data in the memory unit; receiving subsequent magnetometer and gyroscope data at a plurality of valve positions as the valve rotates; calculating the angular displacement from the initial position at each of the plurality of valve positions using the received subsequent gyroscope data; and storing the magnetometer data and associated angular displacement at each of the plurality of valve positions in the memory unit. In this way accurate calibration data specific to the valve on which the sensor unit is installed is used as the basis for position detection. The gyroscope data may be in the form of three axis x, y, z gyroscope data which is integrated to determine the current rotation angle from the initial position in each axis.

Preferably the position of the fully closed and fully open states of the valve are recorded during calibration and the range of the valve also recorded and stored. This may include the number of turns of the valve and number of degrees between fully open and fully closed positions of the valve.

Preferably the processing unit is configured to store the initial gyroscope data as a gyroscope offset value and subtract the gyroscope offset value from the subsequent gyroscope data at each of the plurality of valve positions. In this way the offset corresponding to the initial valve position is removed so that the angular displacement from the initial position is provided. Preferably the initial position is the fully closed or fully opened position and the plurality of valve positions are across the full range of movement of the valve. This may be used to later zero the valve position reading.

Preferably the processing unit is configured to perform a magnetic field conditioning process on the magnetometer data and associated valve position, stored during the initial calibration routine, the conditioning process comprising: determining the first and second active axes within three dimensional magnetometer data received from the magnetometer, the first and second active axes defining the plane of rotation of the valve; interpolating the stored magnetometer and valve position data to expand the array to include the first and second axis magnetometer data at valve positions between the plurality of stored valve positions; and storing the expanded array of first and second axis magnetometer data and associated valve positions in the memory unit.

In this way, only magnetometer data relating to the change in orientation about the axis of rotation is considered in determining the valve position which increases the accuracy and computational efficiency of the estimation. Furthermore, by interpolating the calibration data to expand the calibration data array prior to operation, less time is expended during actual operation of the device in determining the closest stored valve orientation to the received data.

The first and second active axes within the three dimensional magnetometer data may be determined by firstly determine the axis of rotation in the gyroscope data. This may be determined by selecting the gyroscope rotation axis which displays the greatest range of values (after a full rotation of the valve), therefore indicating the rotation primarily occurs about this axis. Since the magnetometer axes are aligned with the gyroscope axes, the active axes may be selected as those which correspond to the plane of rotation from the gyroscope data.

Preferably, during the magnetic field conditioning process before storing the expanded array the processing unit is configured to low pass filter the first and second axis magnetometer data; and normalise the first and second axis magnetometer data. In this way the interpolated data may be smoothed and the noise in recorded data may be removed and normalised values are used for the subsequent comparison of magnetometer data during operation.

The processing unit may further be configured to perform a zero-calibration function for zero-calibration of the device/valve to either a fully open or fully closed position which sets the current position of the valve (to facilitate quick recalibration and reduce drift in current valve position over time). A zero-calibration is performed for a previously calibrated device/valve.

Preferably, the processing unit is configured to perform a valve position detection routine to determine the valve position, the valve position detection routing comprising the steps: receiving magnetometer data; determining the closest magnetometer values stored in the array to obtain the associated valve angle; and calculating the valve position. In this way, once calibration data has been stored in the memory unit (whether by performing a calibration routine or preloading calibration data) the processing unit may perform a valve position detection routine when prompted to determine the valve position. The valve position may be calculated by simply selecting the valve position from the calibration data associated with the stored magnetometer data which most closely matches the received magnetometer data, for example by a best fit calculation. Alternatively, interpolation may be performed to determine a position between two stored positions. In some embodiments the received magnetometer data is converted to the two active axes determined during calibration in order to determine the closest active axes magnetometer data stored in the array.

Preferably the processing unit is configured to low pass filter the received magnetometer data before determining the associated valve angle. In this way, noise is suppressed to increase the accuracy of the position estimation. The filter may be applied after converting the magnetometer data to the two active axes. Optionally, during the valve position detection routine, the processing unit is configured receive data from the gyroscope; calculate a rotation speed of the valve based on the gyroscope data; and stop low pass filtering the received magnetometer data if the calculated speed is above a predetermined threshold.

Although filtering the magnetometer data provides better angle calculation accuracy, the additional computation required to filter the signals may introduce lag which could result in failure to detect rotation if the rotation speed is too great. For example, if the rotation speed is very high, the valve could rotate and catch up with the lagged angle estimate resulting in a full 360 degree turn being missed. By removing the filter if the speed increases beyond a threshold a more instantaneous valve position estimate is provided, avoiding the possibility of error due to lag. Once the rotation speed drops below a threshold, the filter may again be applied to the received magnetometer data to give the more accurate angle estimate.

Preferably, during operation, the valve position sensor is configured to switch between a low energy "sleep" mode and an active, detection mode. In this way the valve position sensor conserves energy and may be used over long periods of time without requiring maintenance such as battery replacement or charging.

For example, in certain embodiments, the one or more micro sensors further include an accelerometer and the processor is configured to receive acceleration data from the accelerometer; wherein the processor is configured to switch between a sleep mode and a position detection mode when a parameter of the received acceleration data exceeds a predetermined threshold, where the parameter is one or more of magnitude of acceleration data, duration of acceleration data, frequency of acceleration data; and in the sleep mode the processing unit is configured to receive accelerometer data at a low sample rate; and in the position detection mode the processing unit is configured to receive data from the magnetometer at a higher sample rate and to determine a valve position of the valve based on the received data.

In this way, the sensor only uses the more energy demanding high sample rate when a movement of the valve is detected, allowing the sensor to subsist in a lower energy mode for long periods of time in between use.

The valve position sensor may include an energy source, the energy source including one or more of a battery, an energy harvester or a solar panel. In this way no dedicated cabling to the sensor is required, considerably reducing the cost of employing the sensors across a system.

For a calibrated valve, turn-of-valve events reported from the valve position transmitter to the receiver may contain the following data: (1) Number of degrees (positive/negative) the valve was turned at this event and (2) Current state of the valve (in "% open" from 0 to 100%) along with timestamp for the event. If no turn-of-valve events are available from the valve position transmitter, a status message which contains the current state of the valve (in "% open") and the date/time the valve was last moved will be sent.

Preferably the micro sensors are based on micro electro mechanical systems (MEMS)—also encompassing Nano Electro Mechanical Systems (NEMS)—and may be incorporated into an inertial measurement unit (IMU). The low cost sensor technology allows the operator of the processing plant to install these sensors on a large number of designated valves for valve position information and monitoring. Such information can be used for detailed operations verification or maintenance planning.

Preferably the sensor housing is arranged to be fixed onto a moving part of the valve and may comprise for example an interchangeable interface or adaptor base for fixation onto the valve. The adaptor structure may be adapted to fit the geometry of different valve configurations, with the interface between the sensor housing and adaptor base being constant. The moving part of the valve may be a wheel, valve handle or stem.

The transmitter preferably comprises a Bluetooth or WiFi transmitter.

The external receiver may be in the form of a mobile device, a smartphone, a gateway, an operator's PDA, mobile phone, tablet, an internet of things (IoT) hub or other form of receiver with means to indicate the event data to a user or relay the information to another form of display. Alternatively the signals can be transmitted to a Wireless Access Point or link and further uploaded to a network cloud solution or similar. Event data transmitted from the sensor unit can be received and displayed in an "App" installed in a cellphone, tablet or by a gateway transmitting event data to a data cloud or to the control room. Event data can be transmitted utilizing Bluetooth Low Energy communication. The received data can be uploaded from the PDA or Wireless Access Point to a data network/cloud where data can be presented for further analysis and actions.

Further, event data from several independent sensor units can be received in the "app". The App can automatically connect to all valve position sensor units included in a current task, and report back regarding which sensor units an event has occurred and the corresponding event data. The report may comprise colouring/labelling sensor units or selected valves in a list. In this way a large number of valves may be monitored simultaneously.

The App can for instance be an Android App installed on a mobile phone. However, other apps/programs for other platforms may of course be used. The App will include the possibility to import a configuration file (for instance xml file) which maps valve position transmitter UUID to device ID/name and which specifies if the valve position transmitter is included in the current task. The configuration file is intended to have three fields: UUID, Name/ID, "included in current task". The last field is either 0 or 1. If a configuration file is loaded, the Name/ID shown for a valve position transmitter is the one from the configuration file. Data read from a configuration file will be retained if the App is closed and restarted The step of calculating final position of the valve can be performed in the valve position transmitter prior to transmitting event data to the external receiver. However, it is also possible that the step of calculating final position of the valve can be performed after transmission to the external receiver, for example in the "app" installed in the cell phone, tablet or local data Wireless Access Point, based on the transmitted event data.

The valve position sensor may optionally include a permanent magnet, fixed to a stationary part of the valve. In this way, a strong well defined local magnetic field in the vicinity of the valve is provided such that, any inaccuracy in angle estimation due to a varying local magnetic field or magnetic moving valve part is minimised.

BRIEF DESCRIPTION OF THE DRAWINGS

Embodiments of the invention will now be described, by way of example only, with reference to the accompanying drawings, in which.

DETAILED DESCRIPTION

Figure 1:
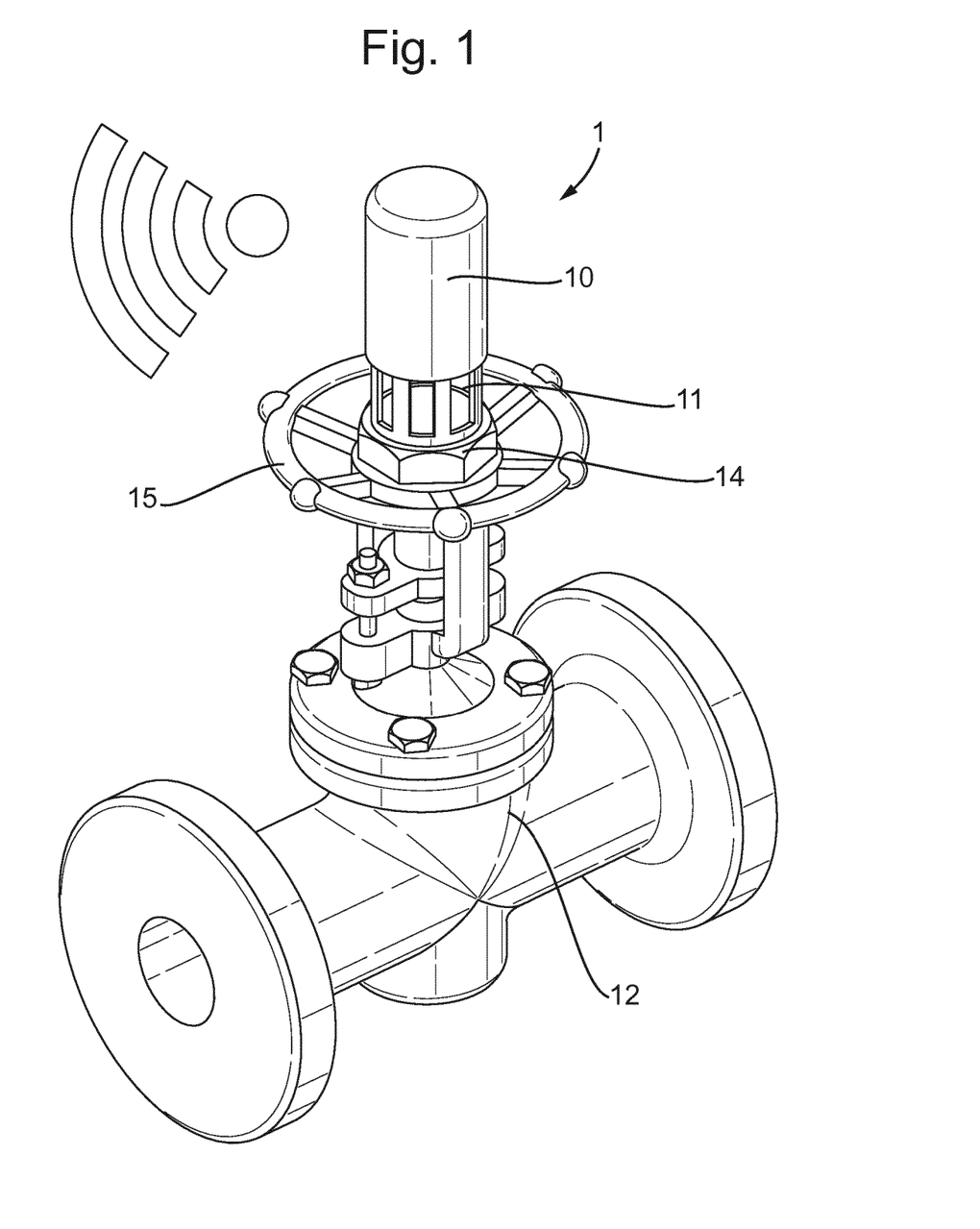
FIG. 1 schematically illustrates a valve position sensor according to the present invention installed on a valve.

FIG. 1 schematically illustrates a valve position sensor 1 according to the present invention. The valve position sensor 1 comprises a sensor housing 10 for placement on an outside of a moveable part of a valve 12 and, within the sensor housing 10, a print circuit board assembly comprising one or more microsensors, the one or more microsensors including a magnetometer. The valve position sensor further comprises a processing unit configured to receive data from the magnetometer and compare the received magnetometer data with predetermined calibration data to determine a position of the valve 12 based on the orientation of the magnetometer relative to the surrounding magnetic field. The sensor also includes a transmitter for wirelessly transmitting event data including valve position data to an external receiver.

In the example of FIG. 1 the valve position sensor 1 includes a fixation base 11 which takes the form of a partially hollow cylindrical cap which is configured to be placed over the rotating valve stem 14 which controls the movements of the valve from an open to close position. The present invention is not limited to such an arrangement and the sensor housing 10 may take a variety of different forms depending on the type of valve to which it is configured to be applied. For example the fixation base may be a replaceable component which is selected so as to provide the attached to a particular valve.

The important aspect is that the valve is positioned such that it moves relative to the surrounding magnetic field such that the change in magnetic field may be detected by the magnetometer in order to determine the position of the valve.

The local geomagnetic field provides a substantially constant magnetic field such that the signals from the magnetometer may be used as a reliable indication of the orientation relative to the field. In some applications, for example when the valve has a magnetic moving component, an additional permanent magnet may be placed in the vicinity of the valve to further strengthen the constant local field to increase the reliability of the valve position estimation. This process is discussed in more detail below with reference to FIGS. 6A and 6B.

In the example of FIG. 1 the sensor rotates with the actuation component (the valve stem 14 and wheel 15) of the valve 12, such that the internal magnetometer moves relative to the surrounding global magnetic field. In this way, the magnetometer data may be used to determine the orientation of the valve position sensor relative to the locally substantially constant magnetic field. By storing an array of predetermined magnetometer data values together with associated valve positions, the processing unit of the valve position sensor may receive current magnetometer data from the magnetometer and compare this to the predetermined calibration data in a memory unit of the sensor in order to determine the current position of the valve position sensor.

The sensor unit 1 preferably further comprises a battery to power the components of the sensor unit. The sensor unit battery is programmed to rest in a deep sleep mode to save battery power and will only be active during the event detection/registration phase and during communication with the external receiver. This means the sensor unit can remain on the valve for long periods of time in between battery changes or recharges and does not require expensive power cabling.

In certain embodiments the sensor unit may include another power source instead of or in addition to the battery. For example a solar panel or other form of energy harvester may be included to power the device and/or recharge the battery to avoid the expense associated with maintenance and changing the battery.

The wireless transmitter may be positioned internal or external to the device housing. In preferable embodiments the transmitter is a Bluetooth Low Energy transmitter providing wireless communication by Bluetooth Low Energy for example BLE 4.2 or 5.0 (or any subsequent release). This allows for long rage communication with low energy usage such that sensor units may be positioned on valves over a large area range with data received at a central receiver. BLE is also advantageous in the reduced energy usage reducing the burden in maintaining the sensor units.

Position Detection Overview

Figure 2:
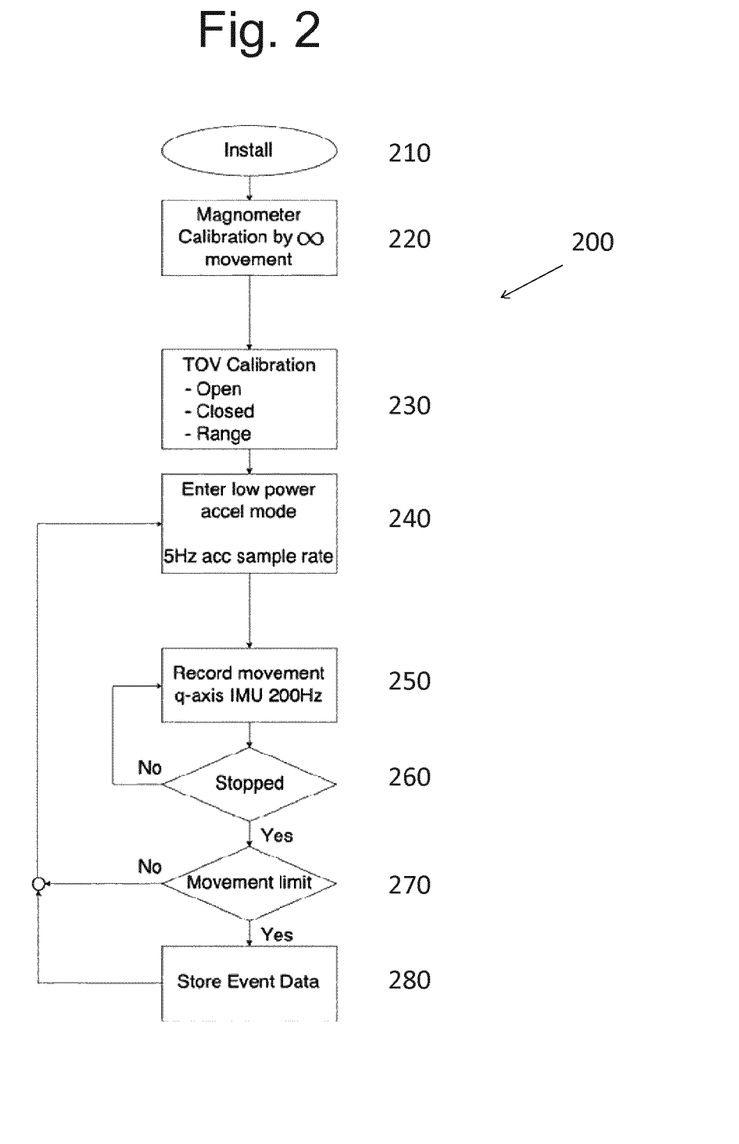
FIG. 2 schematically illustrates a method of operation of a valve position sensor according to the present invention.

An overview of the processing method performed by the valve position sensor according to the present invention is illustrated in FIG. 2.

At step 210 the valve position sensor is installed on the valve. This step involves attaching the valve position sensor to a moving component of the valve such that the valve position sensor orientation changes with that of the moving component of the valve. In particular the valve position sensor should be attached to an actuation component which moves in accordance with the valve position from an open to a closed state. The relative movement between the valve position sensor and the movement component of the valve is minimised via the secure attachment provided by the fixation base 11 such that the valve position sensor orientation is linked to that of the moving components upon which it is mounted.

At step 220 the magnetometer may be calibrated by infinite movement, that is, by moving the sensor unit in a figure of eight shape before attachment. However, step 220 is optional and not required for the full calibration process, as described in more detail below.

At step 230 a turn of valve (TOV) calibration process is performed. This involves turning the valve whilst the processing unit performs a calibration routine in order to associate magnetometer data values with corresponding positions of the valve by sampling the magnetometer values at regular intervals during a process of turning the valve. An array of valve position data and the corresponding magnetometer data values are stored in the memory unit of the sensor. The calibration process is described in more detail with reference to FIG. 3 below.

At step 240 the valve position sensor enters a low power mode. In this mode the processing unit samples the accelerometer at a low frequency sample rate such that battery power is conserved and the pressure sensor unit may exist in a low power, sleep mode for a long period of time. For example, the accelerometer may be set to a 5 Hz sample rate which uses minimal power from the battery.

If valve movement is detected by the accelerometer the processing unit moves to step 250 and switches to a detection mode in which the magnetometer is sampled at a higher sample rate, for example 200 Hz.

In the detection mode the processing unit continuously receives the magnetometer data at the sample rate, compares the received data to the store calibration data and determines the angular displacement of the valve. In this way the angular displacement of the moving valve component from the initial starting point is tracked.

Each time the magnetometer data is sampled, at step 260 the processing unit determines whether the angular displacement is above a predetermined threshold. If this is the case the processing unit determines that the movement has not stopped and the processing unit returns to step 250 and continues to sample the magnetometer data to determine the incremental movement of the valve. Steps 250 and 250 are continually looped as the valve moves to track the rotation from the initial starting position at which the processing unit is initially awoken from the sleep mode in the detection mode at step 250.

Once the processing unit has determined that the movement has stopped when the incremental movement drops below a predetermined threshold at step 260 the method moves to step 270. At this step, the processing unit determines whether the total angular displacement from the initial start position is above a movement limit to determine the total displacement of the valve from the initial wake up from the low power mode and compare this to a movement limit. If the total displacement is less than the movement limit the processing unit returns to low power mode with a low sample rate, with no event data recorded or transmitted, until it is next woken up by an accelerometer signal which is above a certain predetermined threshold.

If at step 270 the displacement of the valve is determined as being greater than the movement limit the method moves to step 280 and a movement of the valve is stored as event data. This event data is wirelessly transmitted with the transmitter to an external receiver to communicate the new valve position. The event data may include the time that the movement was initiated or completed, the total angular displacement from the starting position and the final state of the valve, for example expressed in the form of a percentage open value.

In summary the full operational process of the device can be divided into a calibration process, defined by steps 210, 220 and 230, and an event detection mode, defined by steps 240, 250, 260, 270 and 280. The event detection mode (which is referred to when the valve is described as "in operation") itself includes a valve position (or valve angle) estimation routine. This process is performed at step 250 of the method of the processing unit illustrated in FIG. 2.

The calibration routine, the valve position estimation routine and the event detection mode as a whole are described in greater detail with reference to FIGS. 3 to 5 below.

Calibration Process

Figure 3:
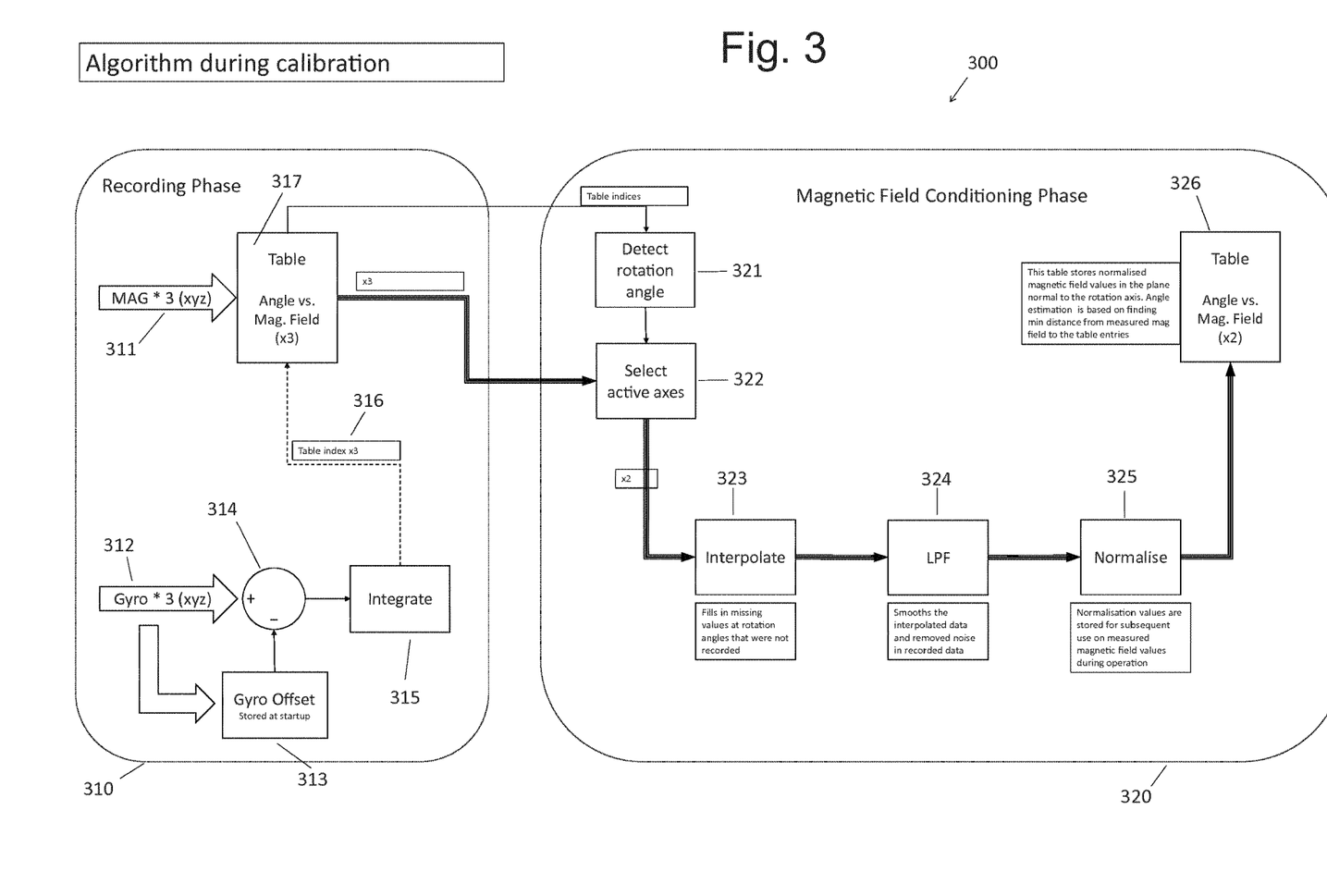
FIG. 3 illustrates the calibration routine performed by the processing unit in a valve position sensor according to the present invention.

FIG. 3 illustrates a more detailed summary of a calibration routine 300 performed by the processing unit of a valve position sensor according to the present invention.

The calibration routine is split into two phases: a recording phase 310 and a magnetic field conditioning phase 320. During the recording phase 310, three dimensional magnetometer data is associated with valve angular position data provided by the gyroscope and stored in an array. During the magnetic field conditioning phase 320 the stored data is processed, by interpolating, filtering and normalising, to update the stored data into a form which provides a faster and more reliable position detection when the position sensor is in operation following calibration.

In the recording phase 310 the valve is rotated while the processing unit receives three dimensional magnetometer data 311 and three dimensional gyroscope data. The gyroscope may have a higher sample rate, for example 200 Hz, with the magnetometer outputting values at a lower sample rate, for example 8 Hz.

At start-up of the magnetic field calibration, and before the valve is rotated, the initial values of the x, y, z gyroscope data are stored at the gyroscope offset at step 313. Preferably the calibration routine is performed through the full range of valve movement, for example from a fully closed to a fully open state. Therefore the initial gyroscope data may correspond to a fully closed state of the valve and is saved as the gyroscope offset.

For example, to prevent the offset from the zero value introducing error into the the subsequent integrations of the gyroscope data to calculate angle, the first (for example) 100 gyroscope data values are averaged and set as the zero value. These initial values are taken with the requirement of less than a second with no movement of the valve. Subsequently it is the difference from this zero offset that is integrated to provide an angle estimate, as will now be described.

As the valve rotates and x, y, z gyroscope data is received by the processing unit at 200 samples a second, at step 314 the gyroscope offset is subtracted from all subsequent gyroscope data points, removing the offset. The x, z, y gyroscope values minus the offset are then digitally integrated at step 315 to provide the current rotation angle from the initial start position. This results in three rotation angles corresponding to each of the three gyroscope axes.

The current rotation angles are indexed in a table at step 316, to associate the current rotation angles with the corresponding magnetic field values.

Whenever the magnetometer outputs a new three axis set of magnetic field strength values, these are stored in an array together with the current angular displacement calculated at 315 in table 317. At the end of the recording phase 310, table 317 therefore provides an array comprising the x, y, z magnetometer field data with corresponding valve rotations in each gyroscope axis from the start position (for example a fully closed position.)

At the start of the magnetic field conditioning phase, the maximum deviation from the start position is used to calculate the total rotation of the valve at step 321. The total rotation of the valve is used to determine the actual rotation axis of the valve at step 322 and used to select the active axes which define the plane of rotation. This involves selecting the gyroscope rotation axis which displays the greatest range of values, indicating the valve rotation has occurred primarily around this axis. Magnetic field data for the plane normal to this gyroscope axis is then taken from the table 317 to be conditioned. In other words the x, y, z data from the magnetometer (collected and stored in table 317) is transformed into the 1st and 2nd active axes, which define the plane of rotation. If the magnetometer axes are aligned with the gyroscope axes, this simply involves selecting the axes which define the plane of rotation (that corresponding with the greatest range of gyroscope values).

At step 323 the 1st and 2nd active axis magnetic field data and corresponding angle data is interpolated. This involves filing in missing active axis magnetic field data in the array at rotation angles at which no magnetic field data was recorded. As described above, the sample rate of the gyroscope is higher than that of the magnetometer so at this step the processing unit interpolates the data to estimate the magnetic field data (in the plane of rotation) at positions intermediate to those for which true data was recorded in the recording phase 310. This improves the speed at which the detection routine can estimate the current angular position as no interpolation need be carried out during operation.

At step 324 the active axis magnetic field data is low pass filtered. This smooths the interpolated data and removes noise in the recorded data which improves the accuracy in the subsequent angle estimation.

At step 325 the two dimensional magnetic field data in the plane of rotation which has been interpolated and filtered is finally normalised to be used for subsequent angle estimation in the valve position detection routine.

The normalised 2D active axis magnetic field data is stored in table 326 together with the corresponding valve position in the form of the angular displacement from the initial starting point. The calibration data array in table 326 is used for the comparison to received magnetic field data in the valve position detection routine to estimate valve angle.

Valve Position Estimation

Figure 4:
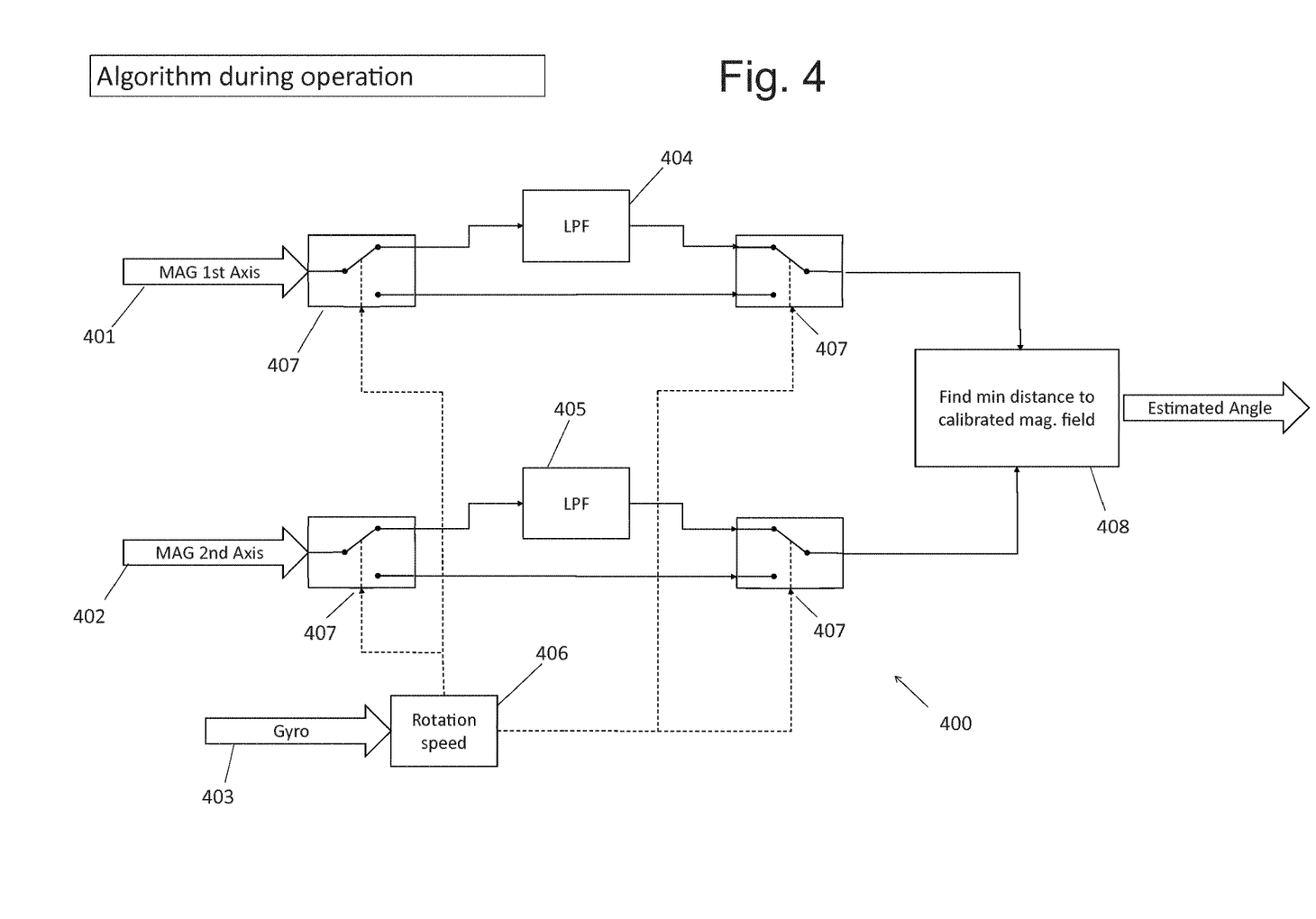
FIG. 4 illustrates the detection routine performed by the processing unit in a valve position sensor according to the present invention.

FIG. 4 illustrates a valve position estimation routine 400 (performed at step 250 of FIG. 2) in which received magnetometer data is compared to the calibration data of table 326 in FIG. 3 to estimate a valve position.

The processor unit firstly converts three dimensional x, y, z magnetic field data received from the magnetometer into two-dimensional 1st and 2nd axis data 401, 402 in the plane of rotation of the valve, as determined at step 322 of the calibration routine 300. If the magnetic field sensor axes are aligned with the gyroscope axes, this may be achieved by simply selecting the two axes which correspond to the plane of rotation from the gyroscope data (as determined at steps 321 and 322 in the calibration process). The processing unit also receives gyroscope data during the valve position estimation routine as indicated by step 403.

Under normal operation, each of the 1st and 2nd magnetic field signals are digitally low pass filtered at step 404 and 405 to suppress noise and give better angle estimation accuracy. This filtering introduces a certain degree of lag which is acceptable under normal rotation speeds of the valve. However if the rotation speed exceeds a certain threshold, the valve rotation may catch up with the lagged angle estimate and a full 360 degree rotation of the valve could be missed resulting in a valve angle estimation error.

To prevent this, at step 406 the processing unit calculates a speed of rotation using the gyroscope data. If this calculated speed exceeds a predetermined threshold the processing unit turns off the low pass filter, illustrated by switches 407, to provide the estimate on the raw 1st and 2nd axis data to provide a faster angle estimation and avoid problems with lag. When the rotation speed drops below the threshold again, the filter is turned back on to provide the more reliable angle estimation.

At step 408, the minimum distance from the 1st and 2nd axis magnetic field data to the calibrated magnetic field data in table 326 is calculated to determine the valve angle corresponding to this entry in table 326. At this stage further interpolation may be carried out to determine the angular position with greater precision (between the angular positions stored in table 326) or alternatively simply the angular position of best fit from the table may be selected as the estimated angle 409 output from the valve position detection routine.

Event Detection Mode

Figure 5:
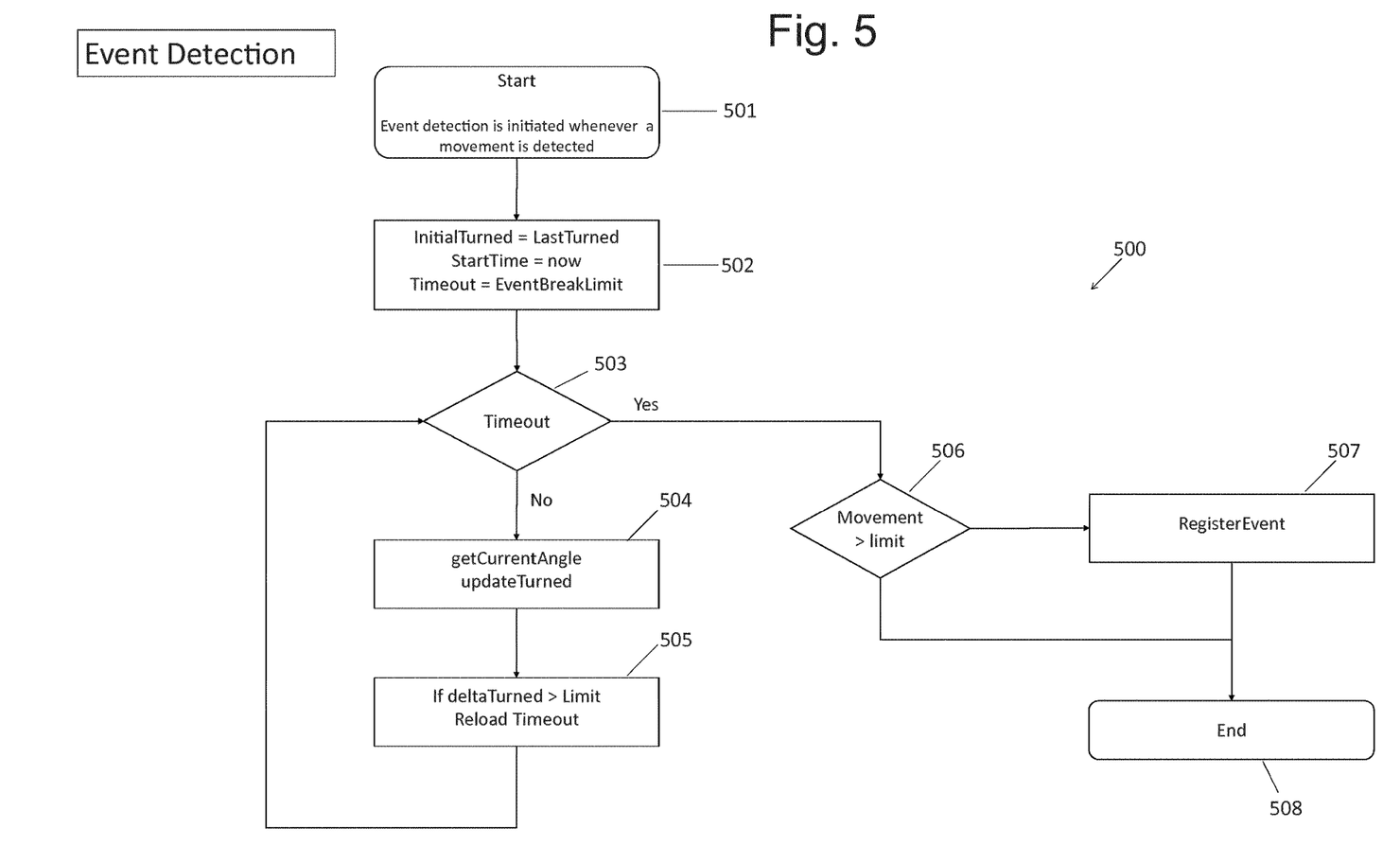
FIG. 5 illustrates the processing steps performed in event detection mode by the processing unit in a valve position sensor according to the present invention.

FIG. 5 illustrates the full event detection process 500 (defined by steps 240, 250, 260, 270 and 280 in FIG. 2) which utilises the above described valve position detection routine to determine the movement of a valve during an event and save or transmit details of the event as event data.

Initially the valve position sensor is in the low power sleep mode, shown in FIG. 2 at step 240. At step 501 the start of event detection is triggered by a movement detected by an accelerometer of the valve position sensor. The wake up threshold may be determined by a threshold magnitude of acceleration detected and may be adapted depending on the specific type of valve and the environment in which it operates. At step 501 the valve position sensor switches from receiving accelerometer data at a lower sample rate to receiving magnetometer data at a higher sample rate in preparation for valve position estimation.

At step 502 event detection initialisation is performed. This involves setting the initial stored start position of the valve to the last position determined. This value is stored in the memory from the previous event detection or pre-programmed to a specific starting point of the valve, for example fully closed or open. The start time is set to the current time and the timeout value is set to a specific duration from the start time. This is a threshold duration, during which, if no movement is detected, the position detection routine is aborted.

At step 503 the processing unit checks whether the timeout duration has elapsed. On first starting event detection this will not be the case and the processing unit will proceed to step 504 in which the above described valve position estimation routine is run to determine an angular displacement of the valve. The estimated valve rotation is then used to update the current stored position of the valve and the processing unit proceeds to step 505.

At step 505 the processing unit determines whether the angle returned by the angle estimate routine of step 504 is greater than a movement limit. If the previous angle returned is greater than the movement limit the processing unit resets the timeout duration and steps 503, 504 and 505 are continuously looped to track the movement of the valve, updating the current valve position repeatedly at 504 until the last incremental angle returned by the valve position estimation routine is below the movement limit when checked at 505.

In this case the timeout duration is not reset and the method returns to check whether the timeout duration has elapsed at step 503. If there is no further significant rotation of the valve beyond the movement limit eventually the elapsed time will exceed the timeout duration and the process will proceed to step 506.

At step 506 the processing unit checks whether the total movement from the initial position set at 502 is greater than a total movement limit. If the total rotation exceeds the limit an event is registered at step 507 and event data is stored. The event data may include the angular rotation from the initial start position during the rotation event, the open status of the valve (for example a percentage open/closed) and the time/date of the event.

The minimum rotation time and rotation angle for an event to be triggered is set to a standard value in the device firmware. For example, the duration and minimum rotation values may be 1 second and 5 degrees, but the values may vary dependent on use and the particular type of valve. The standard values can be modified by a user manually or remotely, as for selected parameters.

At step 508 the processing unit switches back from event detection mode to the lower power mode shown as step 240 in FIG. 2 until it next registers an acceleration above the wake up threshold.

The Receiver

The event data is transmitted with the transmitter to an external receiver. The receiver may take various different forms. For example the external receiver may be a handheld user device, a central receiver which then distributes the information onwards or the cloud.

The event data is transmitted with the transmitter to an external receiver. The receiver may take various different forms. For example the external receiver may be a handheld user device, a central receiver which then distributes the information onwards or the cloud.

In preferable embodiments of the invention the receiver is in the form of an application ("App") running on a user device such as a cellphone, tablet or alternatively a gateway using Bluetooth front end, that is transmitting wirelessly or via cable data to a cloud solution or control system. The App can for instance be an Android App installed on a mobile phone, tablet or other handheld device. However, other apps/programs for other platforms may of course be used. The App will include the possibility to import a configuration file (for instance xml file or similar) which maps device UUID to device ID/name, possibly location, last operational- and maintenance available data and which specifies if the device is included in the current task. The configuration file is intended to have a minimum of three fields: UUID, Name/ID, "included in current task". The last field is either 0 or 1. If a configuration file is loaded, the Name/ID shown for a device is the one from the configuration file. Data read from a configuration file will be retained if the App is closed and restarted.

A new configuration option not visible to the user (only used for the operational modes) is included which determines which devices are shown in the list of devices: Only devices marked as "included in current task" or all known devices (either connected to earlier, in settings file or in range). Below, different operational modes are defined for the App, and a configuration option is included in which the user can choose which operational mode the App operates in.

General mode: In this operational mode, the App will be able to connect to all types of devices and all known devices. The App and sensor can be set up to operate only via encrypted signals and therefore not connectable to other than dedicated units. All events will be shown when connected to a device. Filtering of devices may be done by submitting a task list to the Android or any other OS devices.

The Valve closed/open operational mode, is defined for the companion App. In this mode the App will only connect to "turn-of-valve" type devices.

For each device/valve included in the current task, the App will display the state of the valve in % open when last connected to the device/valve, including the date/time for the last connection and the date/time for the last registered turn-of-valve event. In addition valves which have not been turned in N days (N to be defined by User/Operator) will be marked. For uncalibrated devices/valves, the state of the valve will be shown as NC (for "Not Calibrated"), but other parameters are unchanged.

When clicking on a device/valve, a list of the registered turn-of-valve events for this device/valve will be listed.

For each device/valve, a button will be included for initiating a full calibration of the valve (available after downloading events/status from a device). For devices/valves which have been calibrated earlier, a button (or other UI) for zero-calibration at fully open/fully closed will be provided. Choice of fully open/fully closed for the zero-calibration will be taken from the current state of the valve (i.e. it should not be possible to zero-calibrate if the current state is more than N % from fully open/fully closed, exact value to be defined after pilot testing.

The Android App will normally require a minimum of Android version 4.4, or other Apps may also be incorporated. The App will as a start be optimized for a certain brand and type of Android phones to meet market demand, however alternative Apps will be developed as per marked demand. Scanning/searching for devices will be done automatically with a pause between each new scan. The pause between each scan will be determined during pilot testing.

Figure 6:
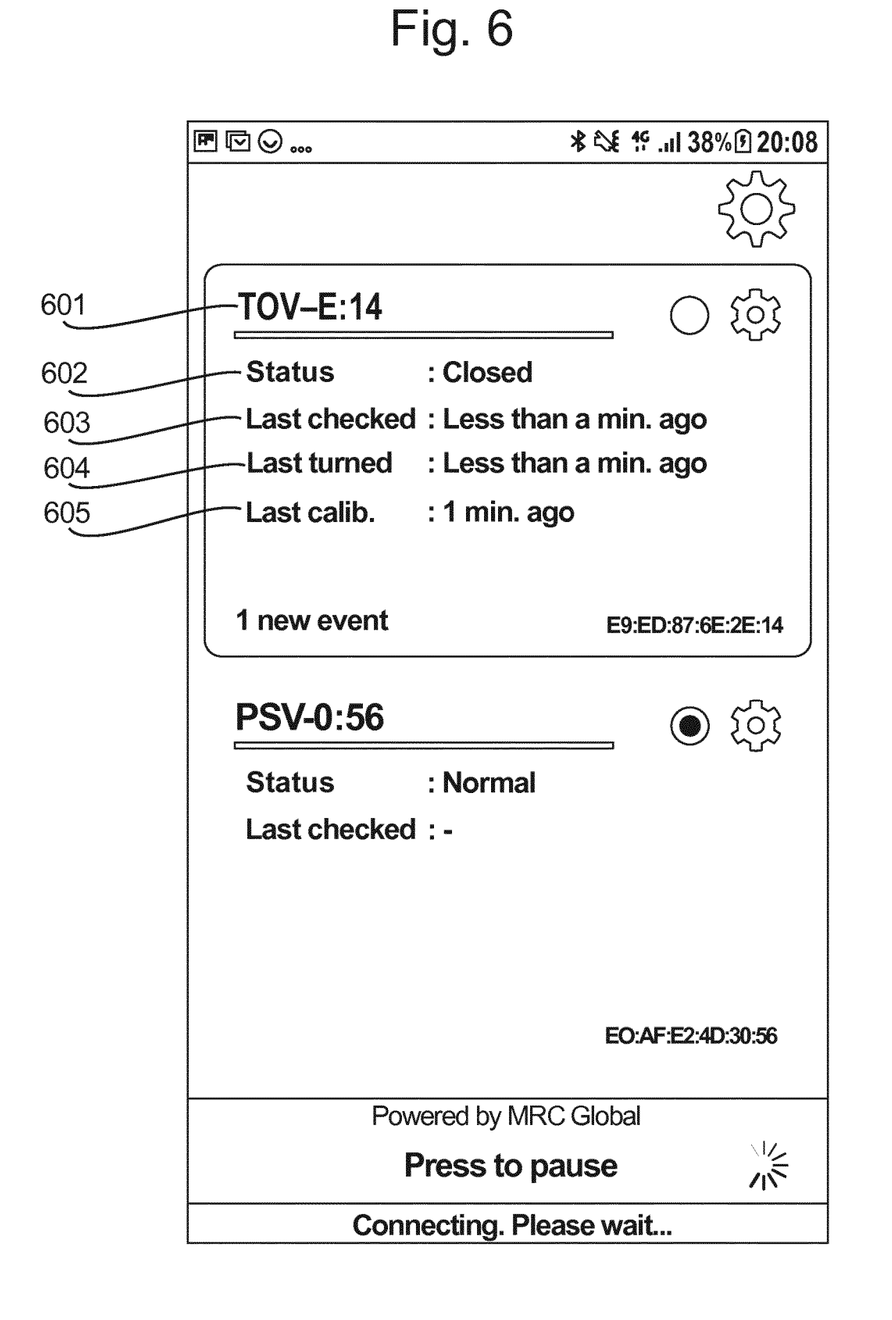
FIG. 6 illustrates a user interface of the receiver used with a valve position sensor according to the present invention.

FIG. 6 illustrates a user interface for an app running on a smartphone, providing the external receiver in an embodiment of the invention. The user interface in this example provides a valve reference 501, a status 602 indicating whether the valve is closed, open or at a specific intermediate position, a time when last checked 603, a time when the valve was last turned 604 and the time when the last calibration was carried out 605.

A user may browse all connected valves in a system to gain an overview of the current operational state of every valve being monitored.

Additional/Optional Features

In the majority of cases the valve position sensor of the current invention can provide a reliable and accurate indication of the valve position based on the local magnetic field, for example the local geomagnetic field.

Figure 7A:
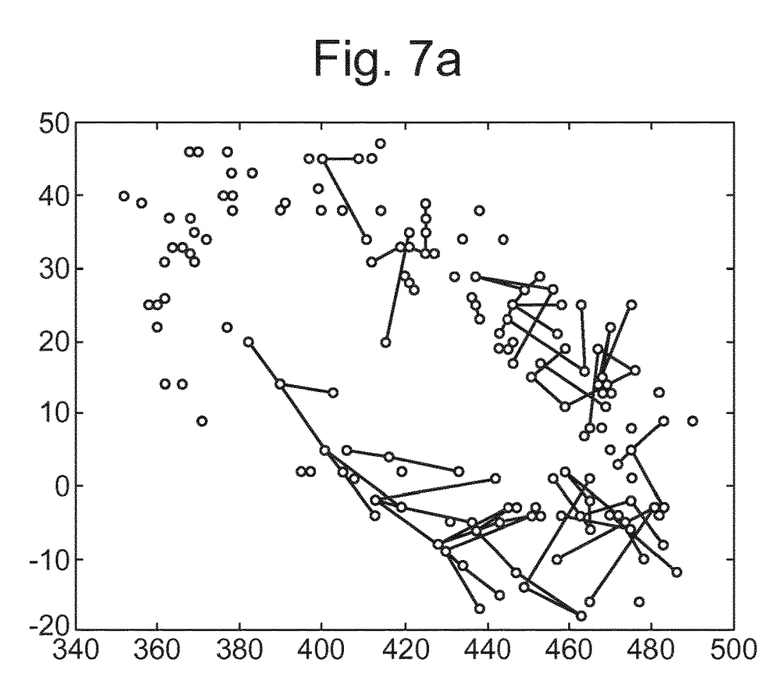
FIG. 7 illustrates the use of an external magnet with a valve position sensor having a magnetic handle according to the present invention.

In areas with varying magnetic fields due to, for example, nearby electromagnetic equipment or if the valve itself has a moving part made of magnetic material the accuracy of the valve position may be reduced. The variation in magnetic field with position for a valve with a magnetic handle is shown in FIG. 7A.

Figure 7B:
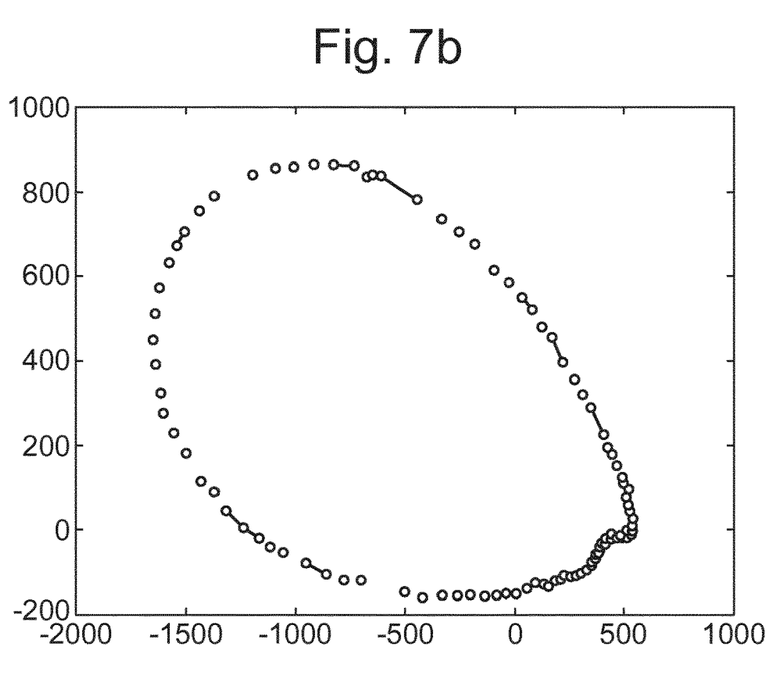

Even in this case, the data may be used to determine a position of the valve, however it is possible that the accuracy of the result is reduced. Therefore the position sensor may optionally include a permanent magnet which is fixed to a stationary part of the valve to provide a strong clearly defined local magnetic field. The application of a permanent magnet to a valve with a magnetic handle is shown in FIG.

7B, in which the magnetic field to position data is much more tightly aligned, allowing a greater accuracy in valve position estimation.

The invention claimed is:

1. A valve position sensor comprising:
   a sensor housing for placement on a moving component of a valve;
   a print circuit board assembly disposed within the housing, the print circuit board assembly comprising:
   one or more micro sensors, the one or more micro sensors including a magnetometer and a gyroscope;
   a processing unit configured to perform a calibration routine during an initial rotation of the valve to associate magnetometer data received from the magnetometer with valve position data received from the gyroscope and store the associated data in a memory unit as calibration data, the calibration data comprising an array of magnetometer data and associated calibration data;
   the processing unit further configured to receive data from the magnetometer when the valve is rotated and compare the received magnetometer data with the stored calibration data to provide an estimate of the valve position; and
   a transmitter for wirelessly transmitting event data including the estimate of valve position to an external receiver.

2. The valve position sensor according to claim 1 wherein the calibration routine performed by the processing unit comprises:
   receiving initial magnetometer and gyroscope data while the valve is stationary at an initial position and storing the associated initial magnetometer and gyroscope data in the memory unit;
   receiving subsequent magnetometer and gyroscope data at a plurality of valve positions as the valve rotates;
   calculating an angular displacement from the initial position at each of the plurality of valve positions using the received subsequent gyroscope data; and
   storing the magnetometer data and associated angular displacement at each of the plurality of valve positions in the memory unit.

3. The valve position sensor according to claim 2 wherein the processing unit is configured to store the initial gyroscope data as a gyroscope offset value and subtract the gyroscope offset value from the subsequent gyroscope data at each of the plurality of valve positions.

4. The valve position sensor according to claim 3 wherein gyroscope data comprises x, y and z axis gyroscope values and the processing unit is configured to integrate the x, y and z axis gyroscope values to calculate the angular displacement of the valve.

5. The valve position sensor according to claim 3 wherein, during the calibration routine, the processing unit is configured to perform a magnetic field conditioning process on the stored data, the conditioning process comprising:
   determining first and second active axes within three dimensional magnetometer data received from the magnetometer, the first and second active axes defining a plane of rotation of the valve;
   interpolating the stored magnetometer and valve position data to expand the array to include first and second axis magnetometer data at valve positions between the plurality of currently stored valve positions; and
   storing the expanded array of first and second axis magnetometer data and associated valve positions in the memory unit.

6. The valve position sensor of claim 5 wherein the processing unit is configured to perform a valve position detection routine to determine the valve position, the valve position detection routine comprising the steps:
   receiving magnetometer data;
   determining the magnetometer values stored in the array which best match the received magnetometer data to obtain an associated valve angle; and
   calculating the valve position.

7. The valve position sensor according to claim 6 wherein the processing unit is configured to low pass filter the received magnetometer data before determining the associated valve angle; and
   the processing unit is further configured to, during the valve position detection routine:
   receive data from the gyroscope;
   calculate a rotation speed of the valve based on the gyroscope data; and
   stop low pass filtering the received magnetometer data if the calculated speed is above a predetermined threshold.

8. The valve position sensor of claim 7 wherein the one or more micro sensors further include an accelerometer and the processor is configured to receive acceleration data from the accelerometer; wherein
   the processor is configured to switch between a sleep mode and an event detection mode when a parameter of the received acceleration data exceeds a predetermined threshold, where the parameter is one or more of magnitude of acceleration data, duration of acceleration data, frequency of acceleration data; and
   in the sleep mode the processing unit is configured to receive accelerometer data at a low sample rate; and
   in the event detection mode the processing unit is configured to receive data from the magnetometer at a higher sample rate and to perform a valve position detection routine based on the received magnetometer data.

9. A method for determining the position of a valve, the method comprising the following steps:
   placing a valve position transmitter on an outside of the valve, said valve position transmitter comprising one or more micro sensors including a magnetometer and a gyroscope;
   performing a calibration routine during an initial rotation of the valve to associate magnetometer data received from the magnetometer with valve position data received from the gyroscope and storing the associated data in a memory unit as calibration data, the calibration data comprising an array of magnetometer data and associated calibration data;
   receiving magnetometer data registered by the magnetometer when the valve is rotated;
   comparing the received magnetometer data to the stored calibration data to provide an estimate of a position of the valve; and
   wirelessly transmitting event data including the valve position estimate to an external receiver.

10. The method according to claim 9 wherein the step of performing a calibration routine comprises:
    receiving initial magnetometer and gyroscope data while the valve is stationary at an initial position and storing the associated initial magnetometer and gyroscope data in the memory unit;
    receiving subsequent magnetometer and gyroscope data at a plurality of valve positions as the valve rotates;

calculating an angular displacement from the initial position at each of the plurality of valve positions using the received subsequent gyroscope data; and storing the magnetometer data and associated angular displacement at each of the plurality of valve positions in the memory unit.

11. The method according to claim 10 wherein after storing the magnetometer data and associated angular displacement data, the method further comprises:

determining first and second active axes within three dimensional magnetometer data received from the magnetometer, the first and second active axes defining a plane of rotation of the valve;

interpolating the stored magnetometer and valve position data to expand the array to include first and second axis magnetometer data at valve positions between the plurality of currently stored valve positions; and storing the expanded array of first and second axis magnetometer data and associated valve positions in the memory unit.

12. The method according to claim 11 wherein the step of comparing the received magnetometer data to the stored calibration data to provide an estimate of a position of the valve comprises the steps:

determining magnetometer values stored in the array which best match the received magnetometer data to obtain the associated valve angle; and calculating the valve position.

13. The method according to claim 12 wherein the method further comprises low pass filtering the received magnetometer data before comparing to the calibration data;

receiving data from the gyroscope;

calculating a rotation speed of the valve based on the gyroscope data; and stopping low pass filtering the received magnetometer data if the calculated speed is above a predetermined threshold.

14. The method according to claim 13 wherein the one or more micro sensors further include an accelerometer and the method further comprises:

receiving data from the accelerometer at a lower sample rate;

switching between a sleep mode, during which accelerometer data at a low sample rate is received and an event detection mode, in which data is received from the magnetometer at a higher sample rate, when the accelerometer data exceeds a predetermined threshold;

comparing the received magnetometer data to predetermined calibration data to provide an estimate of a position of the valve when in the event detection mode.

15. A method of calibrating a valve position sensor comprising the steps:

placing the valve position sensor on a moving component of a valve, the valve position sensor comprising one or more micro sensors including a magnetometer and a gyroscope;

receiving initial magnetometer and gyroscope data while the valve is stationary at an initial position and storing the associated initial magnetometer and gyroscope data in a memory unit;

receiving subsequent magnetometer and gyroscope data at a plurality of valve positions as the valve rotates;

calculating an angular displacement from the initial position at each of the plurality of valve positions using the received subsequent gyroscope data; and storing the magnetometer data and associated angular displacement at each of the plurality of valve positions as calibration data in the memory unit.

\* \* \* \* \*